(12) United States Patent
Kerber et al.

(10) Patent No.: US 9,412,865 B1
(45) Date of Patent: Aug. 9, 2016

(54) REDUCED RESISTANCE SHORT-CHANNEL INGAAS PLANAR MOSFET

(71) Applicant: International Business Machines Corporation, Armonk, NY (US)

(72) Inventors: Pranita Kerber, Mount Kisco, NY (US); Qiqing C. Ouyang, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/090,868

(22) Filed: Apr. 5, 2016

Related U.S. Application Data

(63) Continuation of application No. 14/729,251, filed on Jun. 3, 2015.

(51) Int. Cl.
  *H01L 21/365* (2006.01)
  *H01L 29/78* (2006.01)
  *H01L 29/06* (2006.01)
  *H01L 29/201* (2006.01)
  *H01L 29/207* (2006.01)
  *H01L 29/66* (2006.01)

(52) U.S. Cl.
  CPC ........ *H01L 29/7838* (2013.01); *H01L 29/0649* (2013.01); *H01L 29/201* (2013.01); *H01L 29/207* (2013.01); *H01L 29/66522* (2013.01); *H01L 29/66545* (2013.01)

(58) Field of Classification Search
  CPC ....... H01L 29/78; H01L 29/20; H01L 29/665; H01L 29/66522; H01L 29/66545; H01L 29/6656; H01L 29/7838; H01L 29/0649; H01L 29/201; H01L 29/207
  USPC ......................................... 257/327
  See application file for complete search history.

(56) References Cited

U.S. PATENT DOCUMENTS

| | | | |
|---|---|---|---|
| 2009/0026553 A1* | 1/2009 | Bhuwalka | H01L 29/66356 257/402 |
| 2011/0062520 A1 | 3/2011 | Brask et al. | |
| 2013/0040431 A1 | 2/2013 | Ye et al. | |
| 2013/0248929 A1 | 9/2013 | Ko et al. | |
| 2015/0287807 A1* | 10/2015 | Lee | H01L 29/66545 438/285 |
| 2016/0049477 A1 | 2/2016 | Oxland et al. | |

* cited by examiner

*Primary Examiner* — Peter Bradford
(74) *Attorney, Agent, or Firm* — Cantor Colburn LLP

(57) ABSTRACT

A metal-oxide-semiconductor field effect transistor (MOSFET) and a method of fabricating a MOSFET are described. The method includes depositing and patterning a dummy gate stack above an active channel layer formed on a base. The method also includes selectively etching the active channel layer leaving a remaining active channel layer, and epitaxially growing silicon doped active channel material adjacent to the remaining active channel layer.

1 Claim, 16 Drawing Sheets

US 9,412,865 B1

REDUCED RESISTANCE SHORT-CHANNEL INGAAS PLANAR MOSFET

DOMESTIC BENEFIT/NATIONAL STAGE INFORMATION

This application is a continuation of U.S. application Ser. No. 14/729,251 filed Jun. 3, 2015, the disclosure of which is incorporated by reference herein in its entirety.

BACKGROUND

The present invention relates to a metal-oxide-semiconductor field-effect transistor (MOSFET), and more specifically, to a reduced resistance short-channel InGaAs planar MOSFET.

A MOSFET includes source, drain, and gate terminals. Typically, ion implantation is used to form the source-drain junction. The ion implantation is performed to reduce resistivity. For example, silicon (Si) ions are implanted into a thin layer of Indium Gallium Arsenide (InGaAs). The InGaAs layer may be 10 nanometers (nm) in thickness, for example. The implanted Si is not active until it diffuses into the InGaAs and replaces host ions in the lattice. Active Si (InGaAs doped with active Si) reduces resistivity. Thus, diffusion of the Si, particularly into In, is needed to reduce resistivity.

SUMMARY

According to one embodiment of the present invention, a method of fabricating a metal-oxide-semiconductor field effect transistor (MOSFET) includes depositing and patterning a dummy gate stack above an active channel layer formed on a base; selectively etching the active channel layer leaving a remaining active channel layer; and epitaxially growing silicon doped active channel material adjacent to the remaining active channel layer.

According to another embodiment, a metal-oxide-semiconductor field effect transformer (MOSFET) includes a base comprising a substrate and a buried insulator; a selectively etched active channel layer above the base; an epitaxially grown silicon doped active channel material formed on the base adjacent to the selectively etched active channel layer; and a gate formed above the selectively etched active channel layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-10 illustrate cross-sectional views of intermediate structures in the process flow of a MOSFET fabrication according to an embodiment of the invention in which:

FIG. 1 illustrates a starting substrate having an InGaAs layer formed on a buried insulator layer and a bulk substrate;

FIG. 2 shows the addition of a dummy gate stack on the structure shown in FIG. 1;

FIG. 3 shows the result of patterning the dummy gate stack;

FIG. 4 shows the result of etching sidewall spacers on the structure shown in FIG. 3;

FIG. 5 shows the structure that results from selective etching of the InGaAs layer of FIG. 4;

FIG. 6 illustrates an optional step of p-type ion implantation in the buried insulator layer;

FIG. 7 shows the intermediate structure resulting from epitaxial growth of in-situ silicon doped InGaAs on the buried insulator layer;

FIG. 8 shows the result of silicidation and deposition of a field oxide on the structure shown in FIG. 7;

FIG. 9 results from a CMP process to remove the gate metal stack; and

FIG. 10 shows the structure resulting from deposition of a gate dielectric and gate metal;

FIGS. 11-16 illustrate cross-sectional views of intermediate structures in aspects of the process flow of a MOSFET fabrication according to another embodiment of the invention in which:

FIG. 11 shows the structure that results from selective etching of the InGaAs layer of FIG. 4;

FIG. 12 illustrates an optional step of p-type ion implantation in the buried insulator layer;

FIG. 13 shows the intermediate structure resulting from epitaxial growth of in-situ silicon doped InGaAs on the buried insulator layer;

FIG. 14 shows the result of silicidation and deposition of a field oxide on the structure shown in FIG. 13;

FIG. 15 results from a CMP process to remove the gate metal stack; and

FIG. 16 shows the structure resulting from deposition of a gate dielectric and gate metal.

DETAILED DESCRIPTION

As noted above, ion implantation is typically used to reduce resistivity at the source-drain junction of a MOSFET. The ion implantation is performed with the goal to cause diffusion and, as a result, activation of the implanted ions, which reduces resistivity. However, even following an anneal process, Si diffusion into InGaAs and activation is negligible. In current finFET design, the tall gate structures do not allow for ion implantation due to shadowing. The gates are on the order of 120-150 nanometers (nm) tall, and the fins are on the order of 30-60 nm tall (or taller). As a result, the geometry is not conducive for channeling implantation. On the other hand, when the InGaAs layer is thin, ion implantation will make the layer completely amorphous and no recrystallization can be done. As a result, resistivity reduction resulting from the ion implantation is minimal. Embodiments of the methods and systems detailed herein relate to epitaxial growth of in-situ doped (e.g., Si-doped) InGaAs to reduce resistivity of the source-drain junction.

Figure 1:
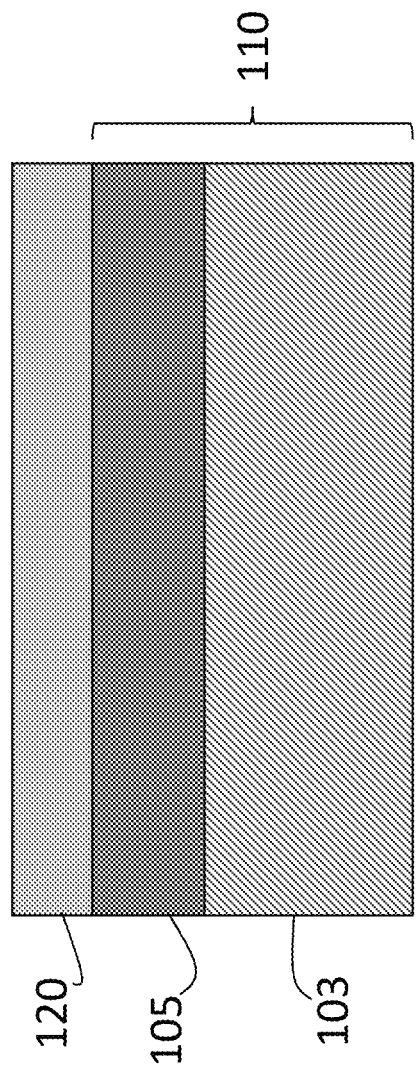
Figure 2:
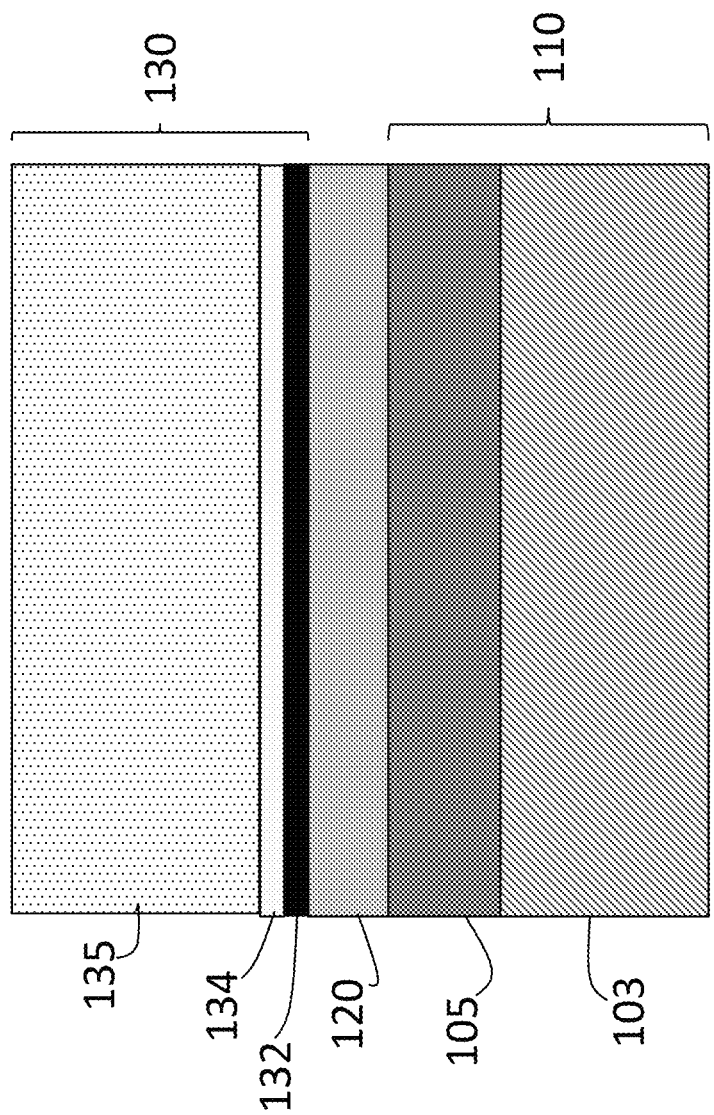
Figure 3:
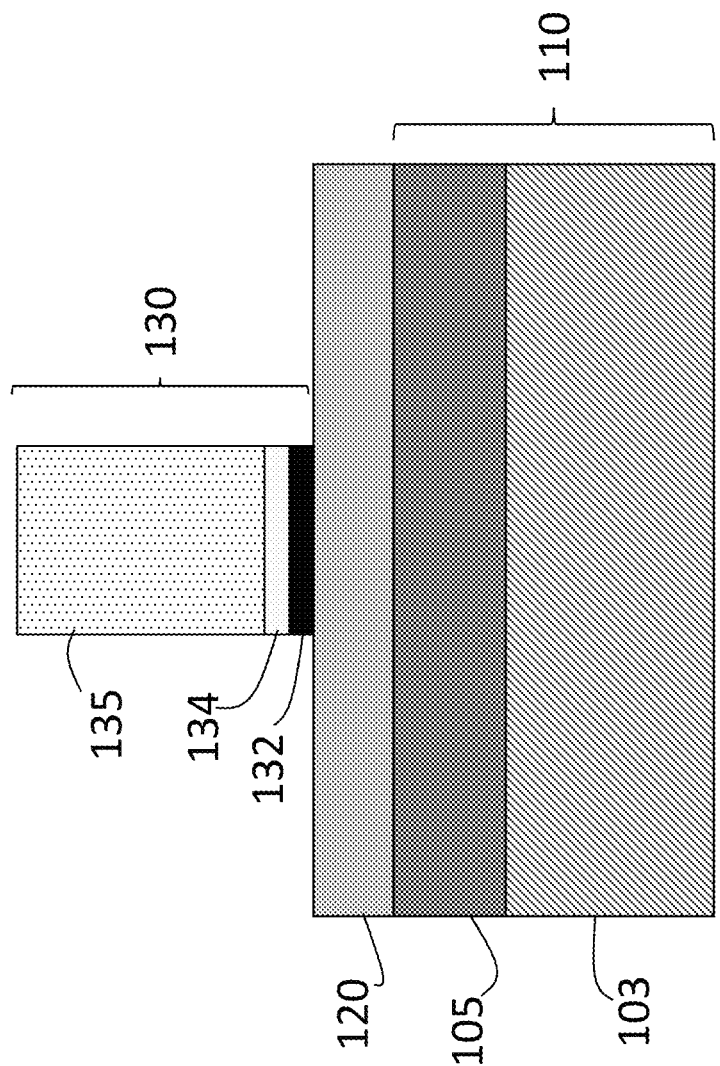
Figure 4:
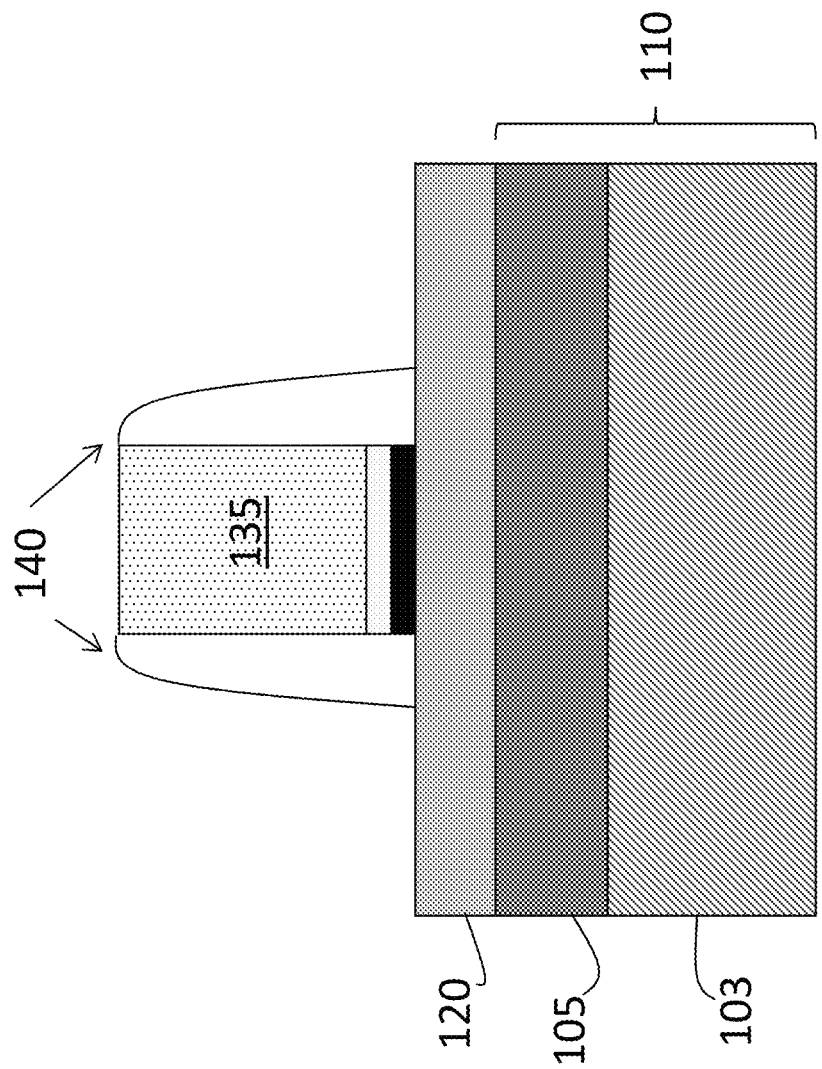

FIGS. 1-10 illustrate a process flow to fabricate the MOSFET according to an embodiment of the invention. In FIG. 1, a base portion 110 of a starting substrate includes a buried insulator layer 105 such as, for example, Indium Aluminum Arsenide (InAlAs) formed on a bulk substrate 103 such as, for example, Indium Phosphide (InP). The base portion 110 may include other insulator and substrate materials in alternate embodiments. An active channel layer such as, for example, an Indium Gallium Arsenide (InGaAs) layer 120 is formed above the base portion 110. This InGaAs layer 120 may be on the order of 10 nanometers (nm), for example. The InGaAs layer 120 and the buried insulator 105 (InAlAs) may be lattice matched to the substrate 103 (InP), for example. The InGaAs layer 120 may be in-situ doped to achieve a particular threshold voltage (Vt) while the buried insulator 105 (InAlAs) is typically undoped. FIG. 2 illustrates the intermediate structure resulting from the addition of a dummy gate stack 130 on the structure shown in FIG. 1. The dummy gate stack 130 is used in the replacement gate process. The dummy gate stack 130 may include a layer 132 of dielectric or amorphous silicon. A dielectric layer 134 is deposited above the layer 132, and a dummy metal layer 135 is deposited on the dielectric layer 134. The dummy metal layer 135 may include metal or polysilicon or a combination of the two. The layer 132 and the dielectric layer 134 may include silicon oxynitride (SiON) or a high-k dielectric, for example. Patterning the dummy gate stack 130 defines the physical gate length and results in the intermediate structure shown in FIG. 3. Depositing another dielectric layer (e.g., nitride) over the wafer and performing a directional (anisotropic) reactive ion etch (RIE) process results in the structure shown in FIG. 4, which includes sidewall spacers 140.

Figure 5:
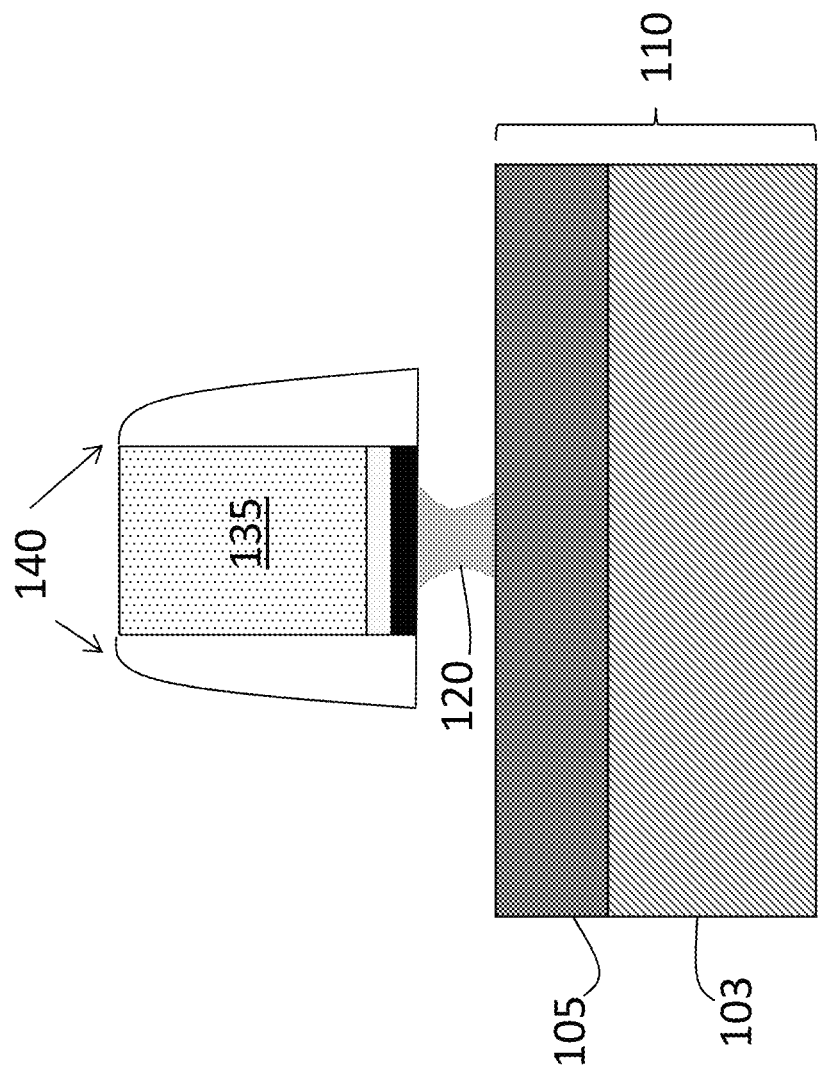
Figure 6:
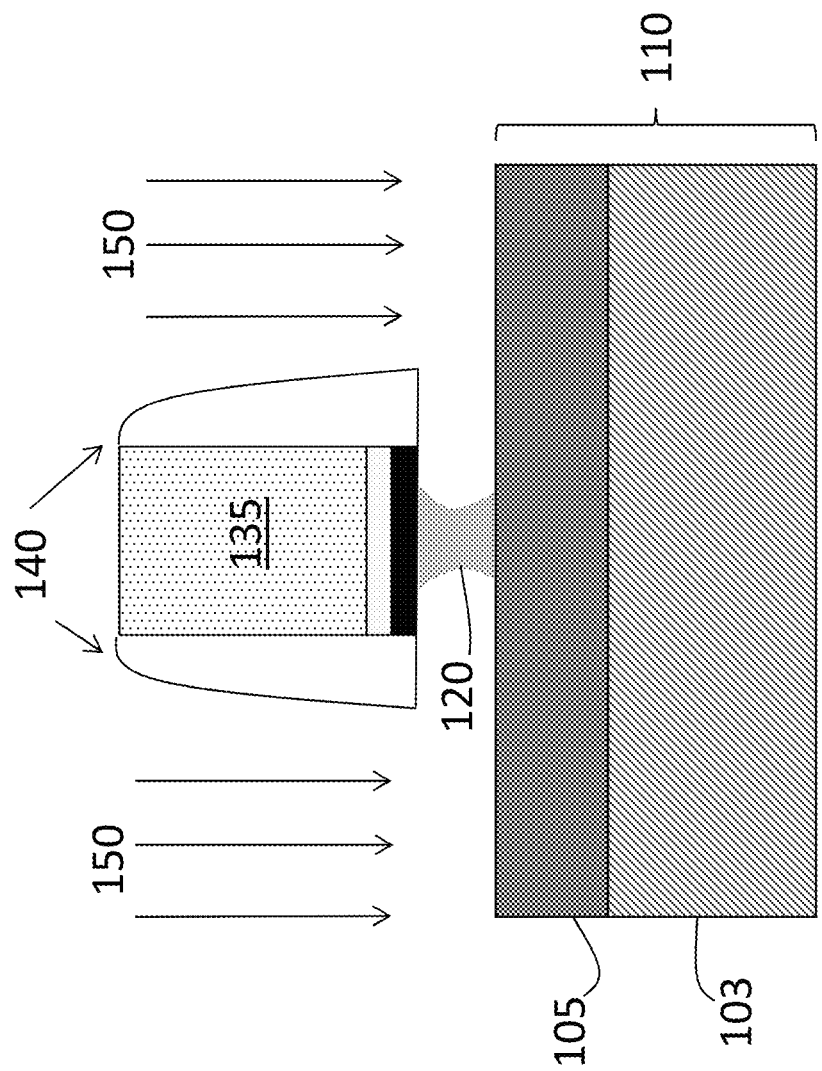

At this stage, a selective etch of the InGaAs layer 120 or channel layer is performed. The embodiment shown in FIGS. 5-10 pertains to an undercut, as discussed below, while an alternate embodiment without the undercut is illustrated in FIGS. 11-16. FIG. 5 shows the structure that results from selective etching of the InGaAs layer 120 of FIG. 4 with an undercut or an etch that extends under the sidewall spacer 140 and the layer 132 of the dummy gate stack 130. The selective etch stops on the buried insulator layer 105. A wet or dry etch may be used. The selective etch may involve, for example, a wet etch process using a citric acid and hydrogen peroxide ($H_2O_2$) mixture. The selective etch may instead involve a dry etch using silicon tetrachloride ($SiCl_4$), silicon tetrafluoride ($SiF_4$), or hydrogen bromide (HBr). The undercut shown in FIG. 5 may result from another anisotropic etching process. FIG. 6 illustrates an optional step of p-type ion 150 implantation in the buried insulator layer 105.

Figure 7:
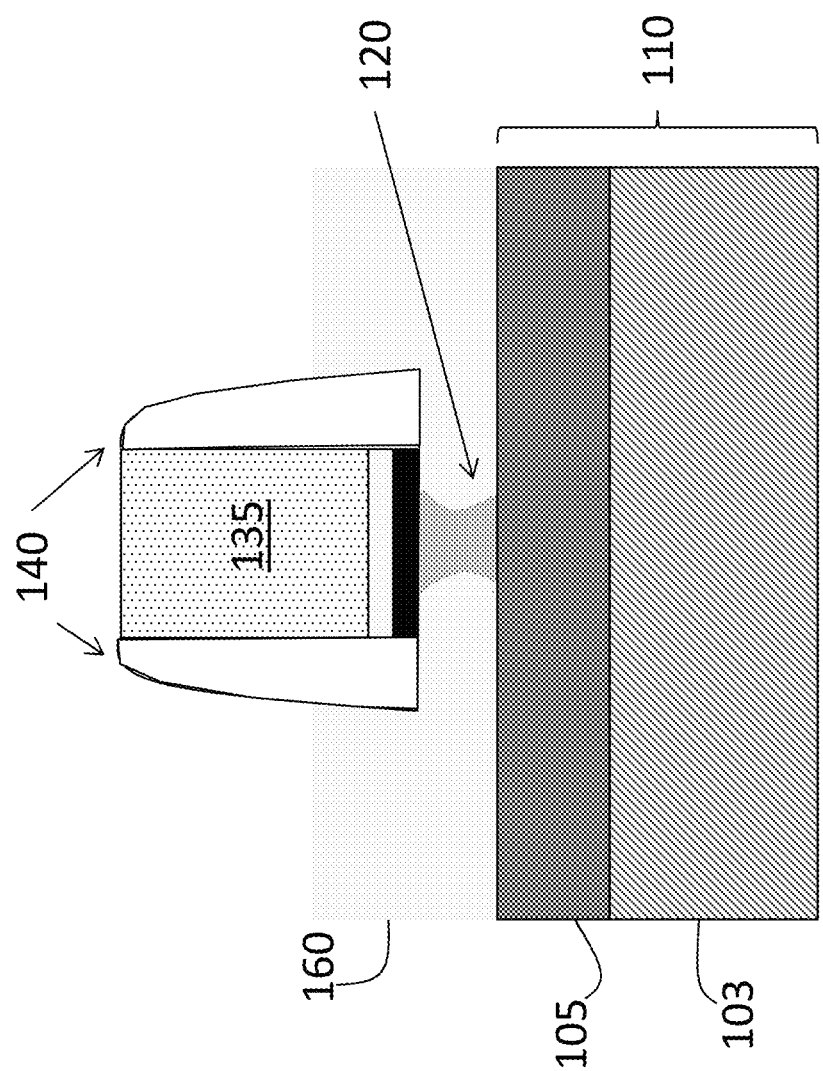

FIG. 7 shows the intermediate structure resulting from epitaxial growth of in-situ silicon doped InGaAs 160 on the buried insulator layer 105. The Indium to Gallium concentration of the in-situ doped epitaxy layer (160) may be different than that of the channel composition (120). Also, as shown in FIG. 7, the silicon doped InGaAs 160 may be thicker than the InGaAs layer 120. The concentration of the silicon in the silicon doped InGaAs 160 is controlled and all the silicon is active. That is, a high doping efficiency is achieved, especially as compared with the ion implantation method. Growth conditions for the silicon doped InGaAs 160 may include metal-organic chemical vapor deposition (MOCVD) selective growth at 635 degrees Celsius with a chamber pressure of 75 Torr. Trimethylgallium (TMGa), trimethdylindium (TMIn), and tertiarybutylarsine (TBA) may be precursors with flow rates of 16, 130, and 60 standard cubic centimeters per minute (sccm), respectively. Silane ($SiH_4$) may be used to achieve in-situ n-type doping (of the silicon doped InGaAs 160) of $4*10^{19}$ $cm^3$. Because the InGaAs layer 120 is p-type, the region above the buried insulator 105 shown in FIG. 7 is npn.

Figure 8:
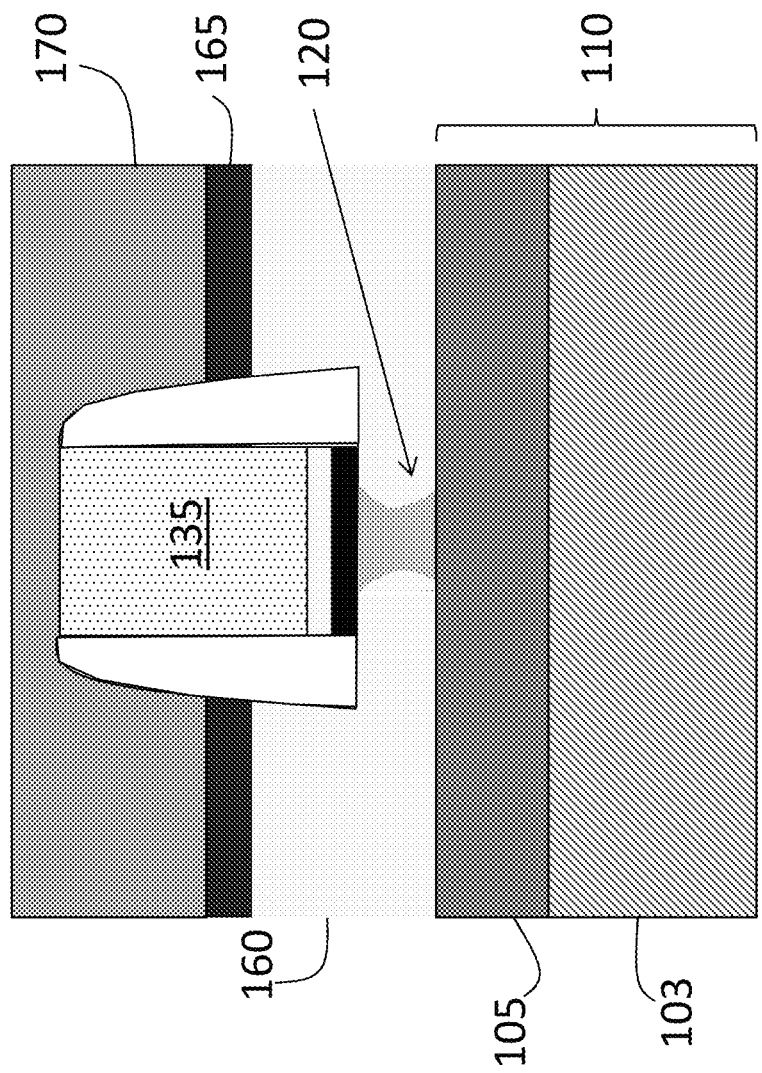
Figure 9:
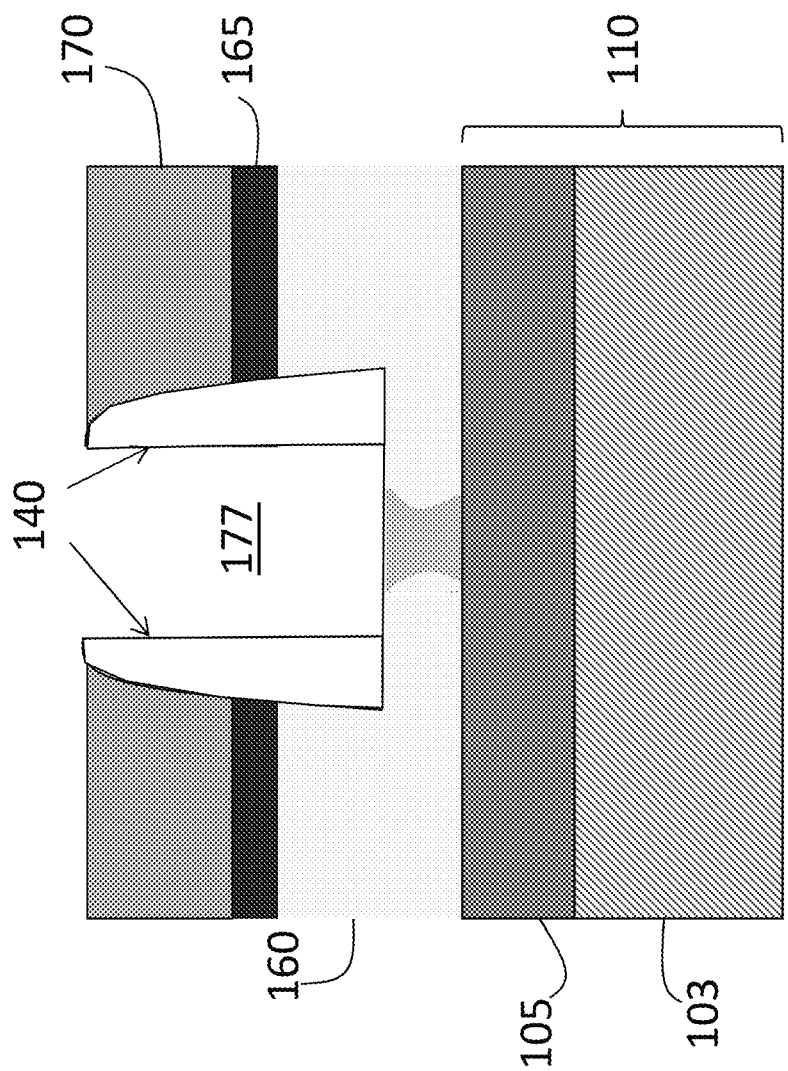
Figure 10:
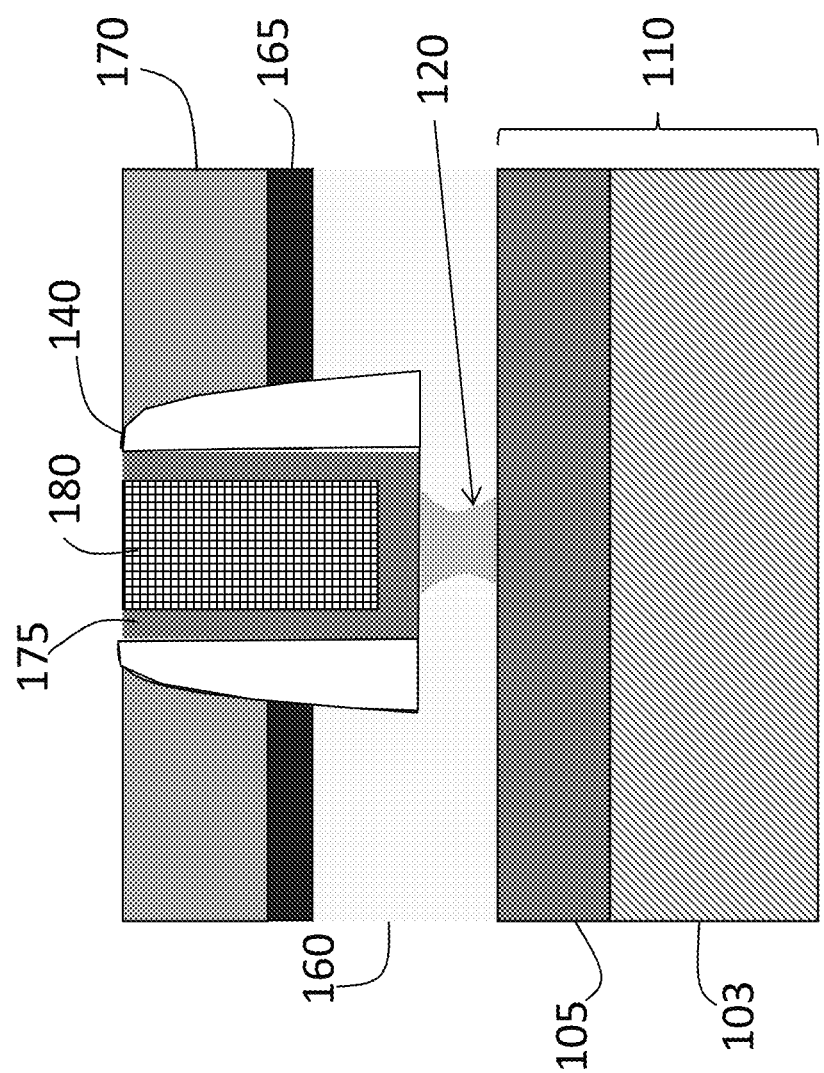

FIG. 8 shows the result of an optional source drain silicidation. In alternate embodiments, a silicide through contact etch may be performed. In the embodiment of FIG. 8, a silicide 165 or metal junction may be deposited followed by a field oxide 170. A chemical mechanical planarization (CMP) process may be performed, if needed, to expose the dummy gate stack 130 (remove excess field oxide 170). This is followed by etching to remove the dummy gate stack 130, leaving a trench 177 in FIG. 9. FIG. 10 shows the result of depositing a gate dielectric layer 175 conformally in the trench 177 and depositing gate metal 180 to fill the trench 177, followed by planarizing. The gate dielectric layer 175 may be, for example, a high-k material such as hafnium oxide ($HfO_2$), aluminum oxide ($Al_2O_3$), or a combination thereof. A CMP process may be used to remove gate layers outside the gate. The structure shown in FIG. 10 includes an undercut (p-type) InGaAs layer 120 with (n-type) silicon doped InGaAs 160 adjacent (on both sides).

Figure 11:
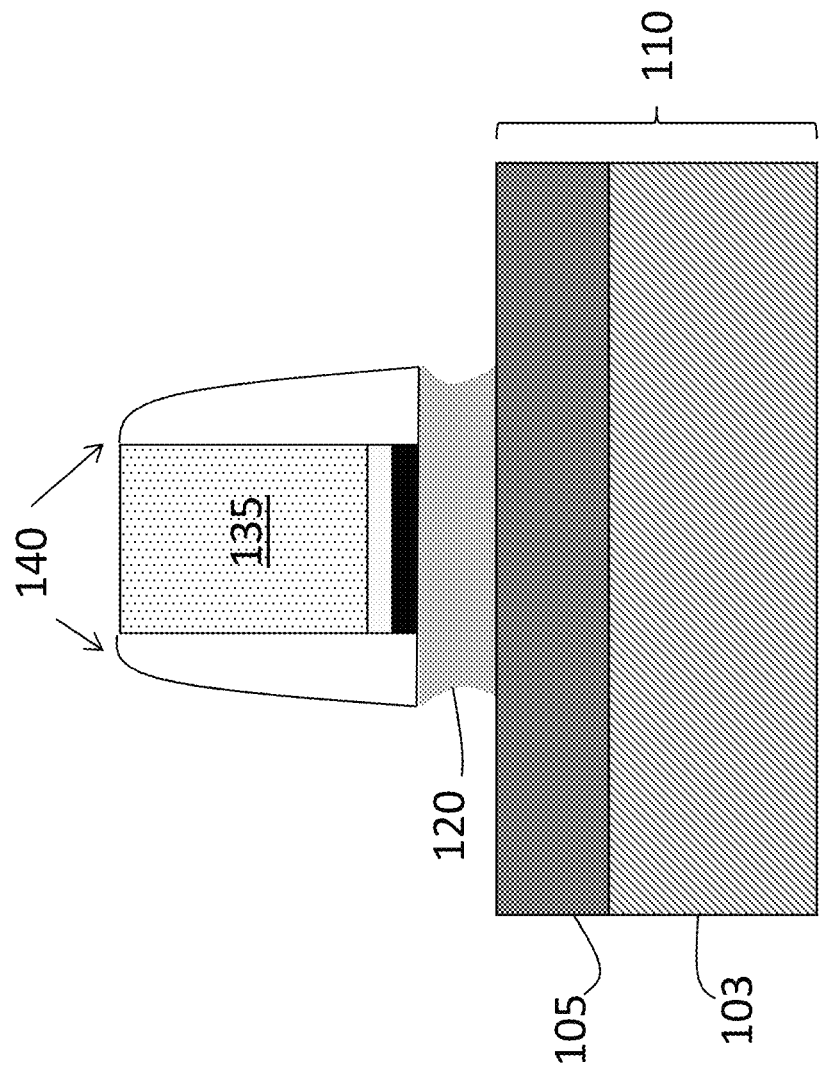
Figure 12:
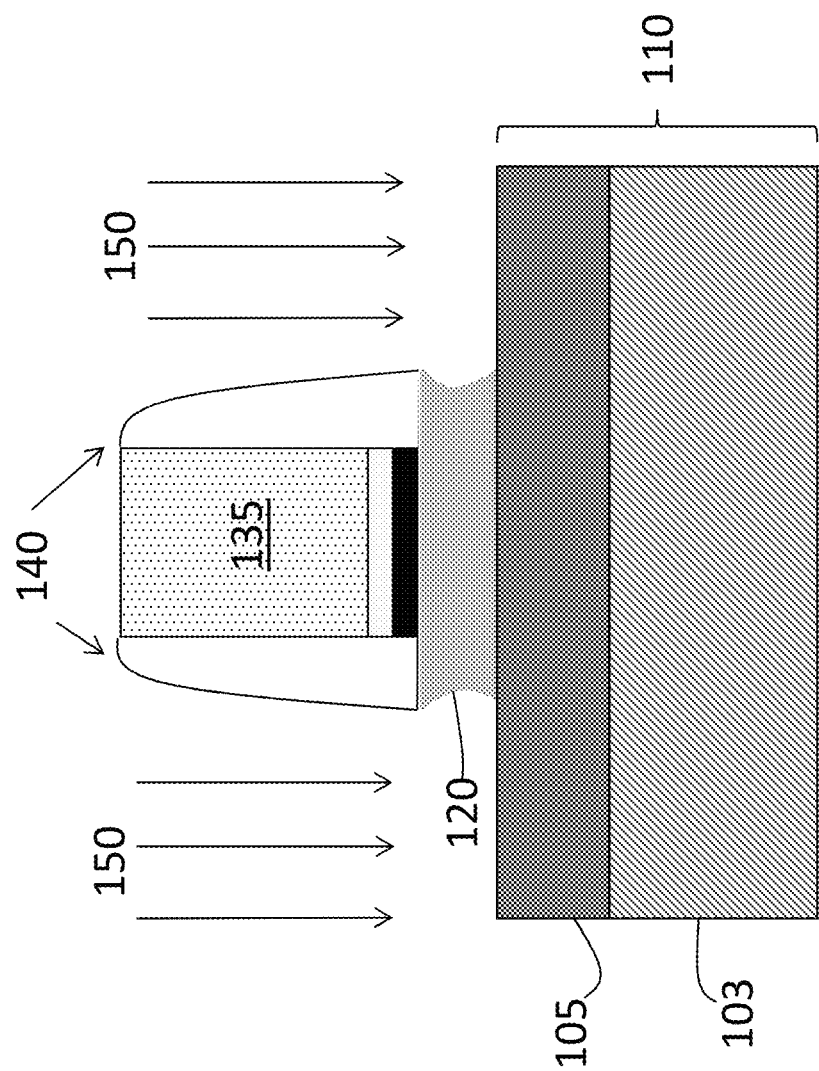
Figure 13:
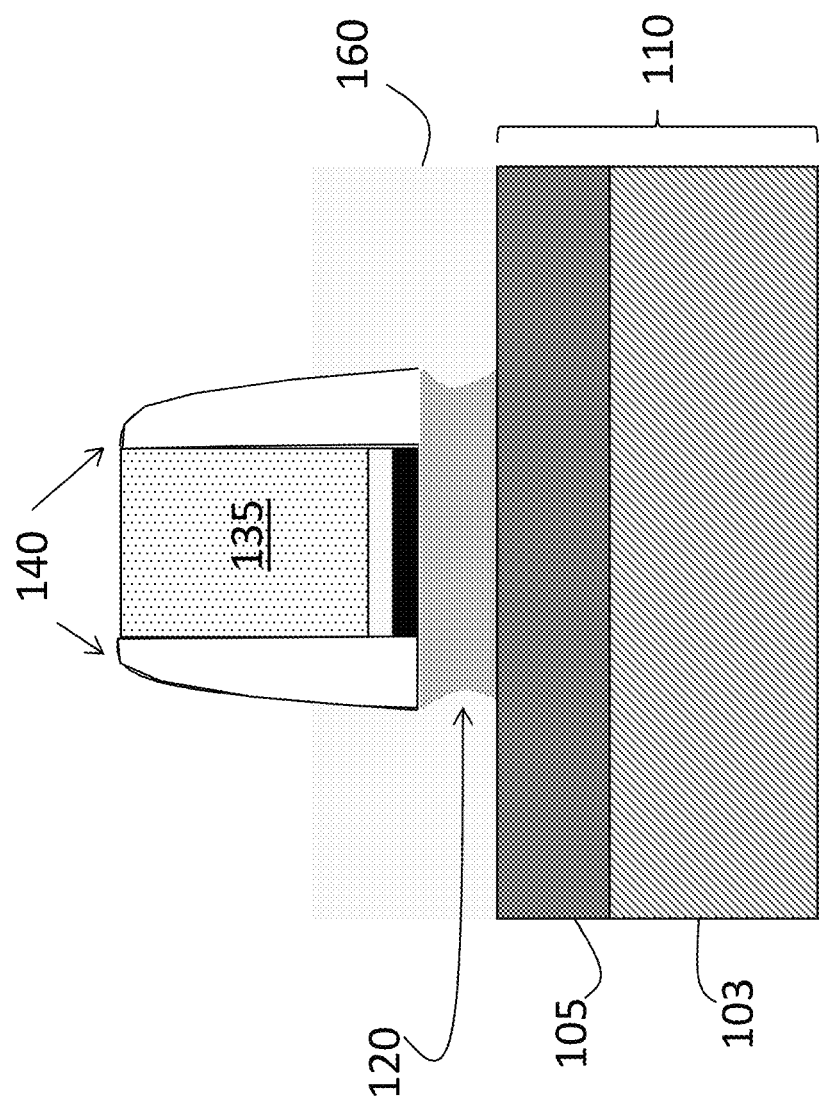
Figure 14:
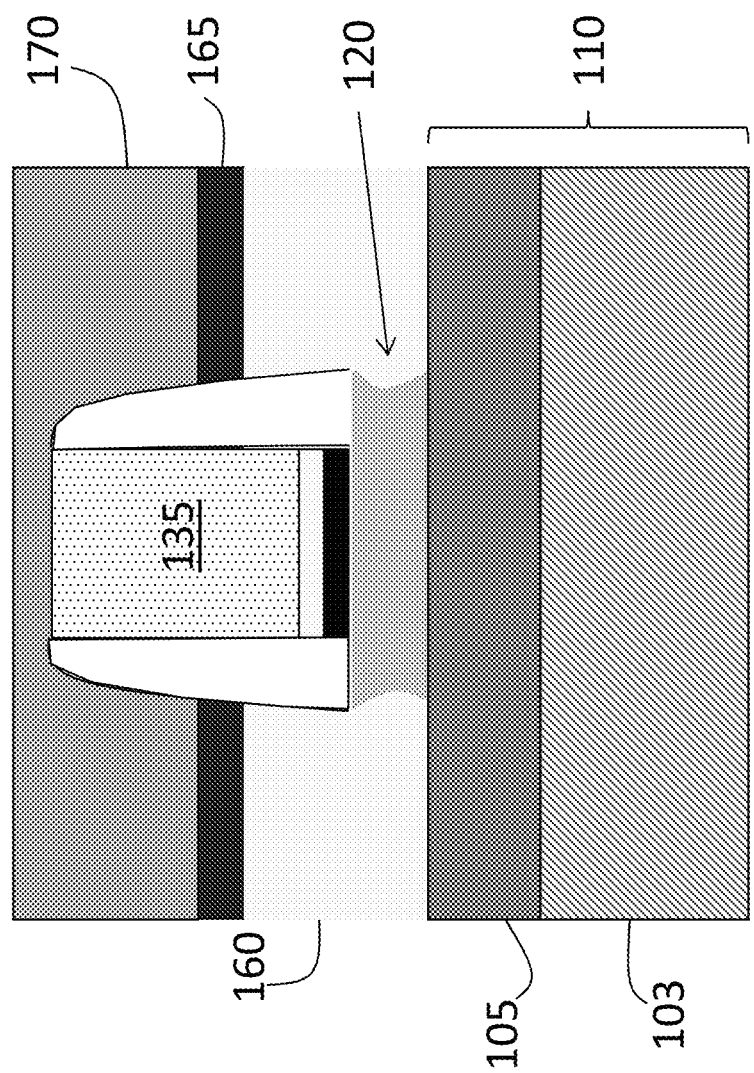
Figure 15:
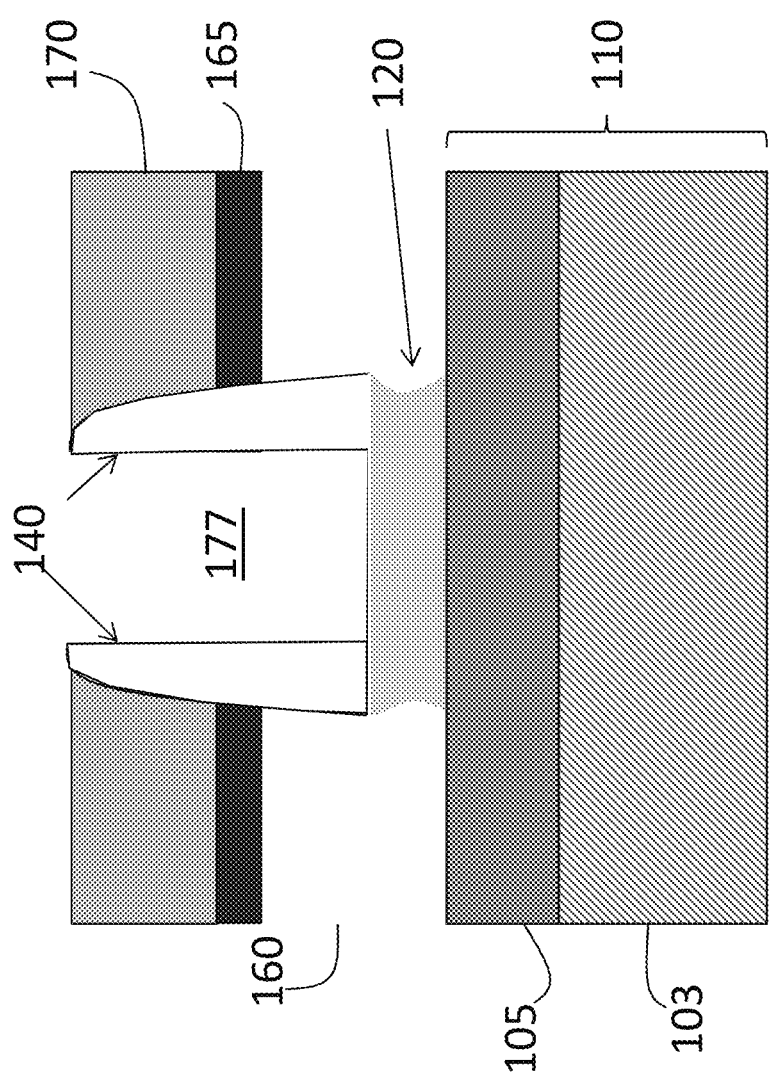
Figure 16:
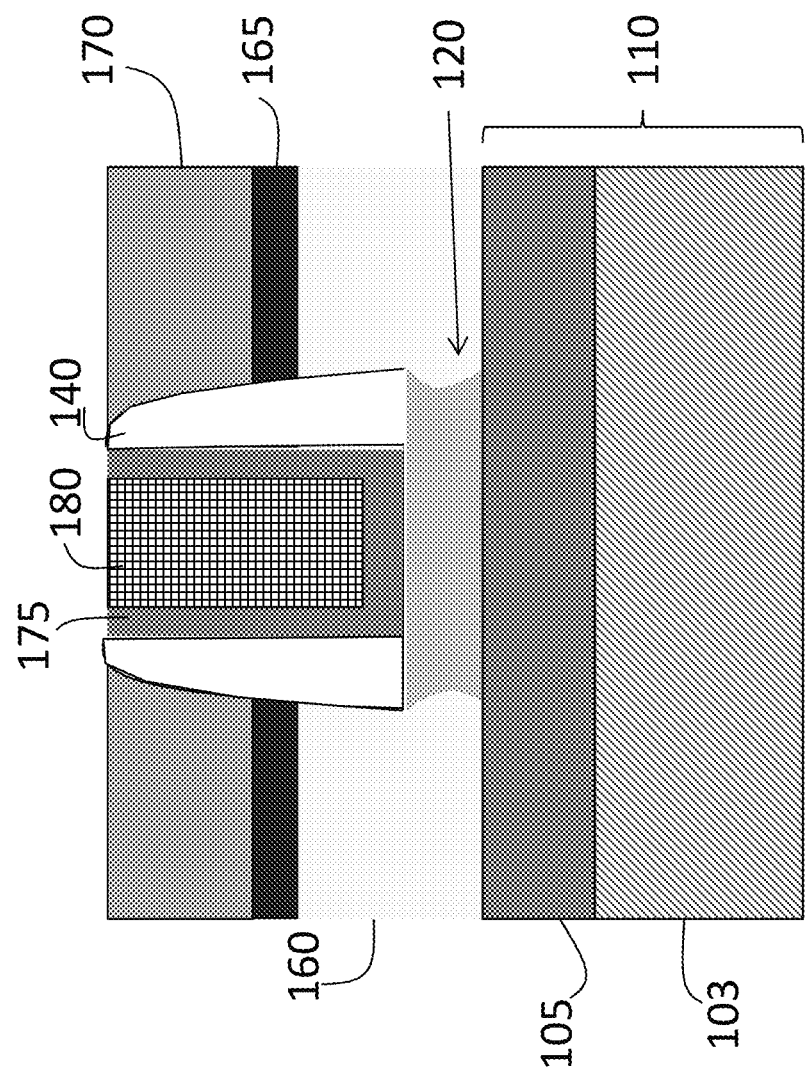

FIGS. 11-16 illustrate cross-sectional views of intermediate structures in aspects of the process flow of a MOSFET fabrication according to another embodiment of the invention. FIG. 11, like FIG. 5, shows the structure that results from selective etching of the InGaAs layer of FIG. 4. The difference between the two embodiments, illustrated by a comparison of FIG. 11 with FIG. 5, is in the amount of the InGaAs layer 120 selectively etched. While FIG. 5 shows the result of an undercut, there is no such undercut in the selective etching used to obtain the structure shown in FIG. 11. The processing steps from this stage are the same. Thus, FIG. 12 shows the optional step of p-type ion 150 implantation in the buried insulator 105 layer. FIG. 13 shows the structure resulting from epitaxial growth of in-situ silicon doped InGaAs 160 on the buried insulator 105 layer. FIG. 14 shows the result of an optional source-drain silicidation in which a silicide 165 and field oxide 170 are deposited on the silicon doped InGaAs 160. In FIG. 15, the result of a CMP process is shown. The dummy gate stack 130 is removed and a trench 177 is left in FIG. 15. FIG. 16 shows the result of depositing a gate dielectric 175 and gate metal 180 in the trench 177.

MOSFETs fabricated according to the embodiments discussed herein differ structurally from those fabricated by previous processes. Specifically, the in-situ silicon doped InGaAs layer 160 is structurally different than a silicon ion implanted InGaAs layer according to prior art processes. This structural difference manifests in the resultant sheet resistance Rs and, more specifically, decreased Rs for in-situ silicon doped InGaAs (160). Based on experimental results, for example, for a 10 nm InGaAs layer implanted with silicon ions, the resultant Rs is 500-1500 ohm/square (where ohm/square is a unit of heat resistance). For a 10 nm InGaAs layer formed as in-situ silicon doped InGaAs (160), on the other hand, the resultant Rs is only on the order of 53 ohm/square. The structural difference is also discernable through secondary-ion mass spectroscopy (SIMS) characterization. The silicon ion implantation process results in a gradual decrease in the silicon (dopant) concentration as a function of depth. This is referred to as an implantation tail. The in-situ silicon doped InGaAs 160, on the other hand, shows an abrupt change in the silicon (dopant) concentration as a function of depth such that there is no implantation tail.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a metal-oxide-semiconductor field effect transistor (MOSFET), the method comprising:
    forming a base by depositing a buried insulator layer on a substrate;
    forming an active channel layer on the base, the active channel layer comprising Indium Gallium Arsenide (InGaAs);
    depositing and patterning a dummy gate stack above a portion of the active channel layer formed on the base, the dummy gate stack including a dielectric or amorphous silicon layer;
    selectively etching the active channel layer leaving a remaining active channel layer, the selectively etching including undercutting to etch some of the active channel layer between the dummy gate stack and the base;
    performing a p-type ion implantation in the buried insulator after the selectively etching the active channel layer;
    epitaxially growing silicon doped active channel material on the base adjacent to the remaining active channel layer after the performing the p-type ion implantation, the epitaxially growing the silicon doped active channel material being based on metal-organic chemical vapor deposition (MOCVD) and the epitaxially growing the silicon doped active channel material including growing the silicon doped active channel material to a thickness greater than a thickness of the remaining active channel layer.

* * * * *